United States Patent
Minkler et al.

(10) Patent No.: US 9,305,634 B1
(45) Date of Patent: Apr. 5, 2016

(54) PARKING ADDRESS SCHEME FOR REDUCING RISK OF SHORT CIRCUITS DURING MEMORY READOUT

(71) Applicant: Forza Silicon Corporation, Pasadena, CA (US)

(72) Inventors: Michael Minkler, Claremont, CA (US); Loc Truong, Huntington Beach, CA (US)

(73) Assignee: Forza Silicon Corp., Pasadena, CA (US)

( * ) Notice: Subject to any disclaimer, the term of this patent is extended or adjusted under 35 U.S.C. 154(b) by 0 days.

(21) Appl. No.: 14/596,086

(22) Filed: Jan. 13, 2015

Related U.S. Application Data

(60) Provisional application No. 61/926,614, filed on Jan. 13, 2014.

(51) Int. Cl.
*G11C 8/10* (2006.01)
*G11C 11/418* (2006.01)
*G11C 11/419* (2006.01)
*H04N 5/3745* (2011.01)

(52) U.S. Cl.
CPC ............. *G11C 11/418* (2013.01); *G11C 8/10* (2013.01); *G11C 11/419* (2013.01); *H04N 5/3745* (2013.01)

(58) Field of Classification Search
CPC ........................................................ G11C 8/10
USPC ............................................ 365/203, 230.06
See application file for complete search history.

(56) References Cited

U.S. PATENT DOCUMENTS

| | | | | |
|---|---|---|---|---|
| 5,115,413 A * | 5/1992 | Sato | ..................... | G11C 7/1075 365/189.04 |
| 6,549,479 B2 * | 4/2003 | Blodgett | ............. | G06F 13/1636 365/222 |

* cited by examiner

*Primary Examiner* — Huan Hoang
*Assistant Examiner* — Jay Radke

(57) ABSTRACT

The invention comprises an improved process of reading out SRAM or like memory elements which utilize pre-charging of cell output buses. In the output configuration of the invention, Gray Code counter outputs are used as inputs in a decoder block, the decoder block being configured to output a valid column selection address for every two address inputs. These column outputs are mapped sequentially to the columns of the memory array, such that the columns are sequentially read out, each readout operation being interspersed with a parking interval. The Gray code address inputs reduce readout addressing errors and the parking interval creates a delay between cell readout operations that reduces glitch errors.

9 Claims, 3 Drawing Sheets

PARKING ADDRESS SCHEME FOR REDUCING RISK OF SHORT CIRCUITS DURING MEMORY READOUT

CROSS-REFERENCE TO RELATED APPLICATIONS

This application claims the benefit of priority to U.S. Provisional Application Ser. No. 61/926,614, entitled "Parking Address Scheme for Reducing Risk of Short Circuits During Memory Readout," filed Jan. 13, 2014, the contents which are hereby incorporated by reference.

STATEMENT REGARDING FEDERALLY SPONSORED RESEARCH OR DEVELOPMENT

Not applicable.

REFERENCE TO SEQUENCE LISTING, A TABLE, OR A COMPUTER PROGRAM LISTING COMPACT DISK APPENDIX

Not Applicable

BACKGROUND AND SUMMARY OF THE INVENTION

Digital image sensors employ massive arrays of pixels. Each row of the array is read out sequentially, with the voltage signal from each of the individual pixels of the row output on parallel column bus lines. These signals are captured by an analog to digital converter and converted to digital values, which are typically stored in a temporary/volatile memory means such as an SRAM memory element. Subsequently, the stored data from the memory means is read out of the volatile memory means for further processing and/or durable storage.

Following analog to digital conversion, pixel output values comprising a series of bits are stored as separate "words" in the memory array, the words being a series of memory cells making up a column. Columns are read out sequentially. When a column is selected for readout, each of the cells in the column are read out simultaneously to a set of data buses which are in connection with an external device such as a signal processing or memory device. Between each readout of a column on the set of data buses, the bus lines are reset by application of a pre-charging voltage, to clear residual signal, reset the lines to a reference voltage, and improve signal resolution.

The alternating cycles of pre-charge and readout must be carefully timed. If readout overlaps with column pre-charging, there is a risk of a short circuit resulting from the pre-charge voltage being applied simultaneously with the memory cell output. In ideal operation, the pre-charging step is completed and the bus lines have settled to the reference voltage prior to the cell outputs from next column readout. However, in actual operation, delays address resolution, opening and closing of column selection gates, and other factors often lead to overlap between the pre-charging and readout steps, resulting in short circuits or "glitches."

Accordingly, there is a need in the art to prevent short circuit glitches from occurring when reading out multiple columns of a SRAM or like memory device. The invention comprises a memory array readout scheme wherein an alternating series of parking intervals between each readout is utilized to take the readout circuitry completely off-line for a short time interval, allowing a clean transition from pre-charge step to readout step. During this period, the read-out circuitry is "parked" and inactive such that there is no connection to the external output during the pre-charging step and pre-charging signals can settle.

The novel parking scheme of the invention is enabled by the use of Gray code address inputs and a unique decoder configuration which takes the readout circuitry offline during the pre-charging step. In essence, the column readout signals are spaced every two or more counts of the input address generator to create the parking interval, as described below.

DETAILED DESCRIPTION OF THE INVENTION

Figure 1:
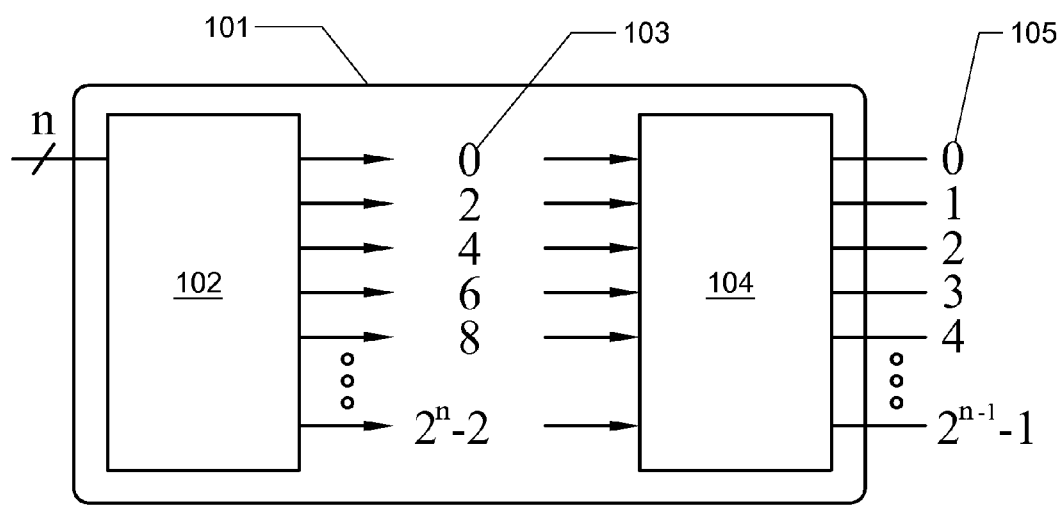
FIG. 1 is an exemplary diagram of decoder block functions of the invention.

The invention comprises methods for carrying out memory cell readout operations, and also encompasses systems and circuits which are configured to perform such operations, as set forth below A first element of the invention is a memory array. The memory array of the invention may be any memory array, especially volatile high-speed memory devices such as static RAM or SRAM memory devices. Other read-write memory array devices, such as DRAM or Flash, or read-only memories, such as programmable fuse arrays, can be utilized in practice of the invention. Such devices comprise an array of cells, each such cell capable of storing a digital signal. "Words" are a sequence of bits corresponding to a specific value (for example, a pixel signal value) that are stored in a block of sequential cells, referred to herein as a column.

The separate bits of the words in each column may be simultaneously read out to an external signal processing or storage device by readout on a parallel series of column output buses. Typically, each bus feeds into a sense amplifier, the sense amplifiers being external or being in connection with the external signal processing or storage device. Prior to column readout, the parallel readout buses are pre-charged to a reference voltage to improve signal resolution, by pre-charging circuits that are in or in connection with the array.

In some implementations, each cell accesses a single readout bus, and the description herein will refer to this implementation of the invention. However it will be understood that in other implementations, individual cells may have two bit-line outputs and will require two buses.

The stored value in each cell is read out to the external device when the transistor gate or gates connecting it to the readout bus is/are selected. Application of a voltage capable of opening such gates is asserted by a column address decoder. This device simultaneously asserts "open" signals to all the cells in a selected column, which such signals open gates that allow the cells' stored signals to output to their respective data buses. Starting with the first column, the columns are sequentially read out, and upon completion of the readout of every column in the array, the cycle is repeated starting again with the first column.

In the practice of the invention, the column decoder is specially configured with two features. A first feature is that the input addresses for the decoder are generated by a Gray code counter. The Gray code counter inputs a sequence of binary Gray code numbers which increase by one with each increment of the counter. The inputs may comprise any implementation of Gray code, or any similar code, wherein two sequential input numbers differ only by one bit. For example, reflected binary Gray code may be used. Gray code outputs may comprise any number of bits, for example, 3, 4, 5 or more bits. The reason for utilizing Gray code address inputs is to reduce address read errors. At high rates of switching, inputs having multiple bit changes may be more easily misread by the decoder logic circuit because the bit switches do not settle simultaneously, resulting in a read error and selection of the wrong column for readout.

The parking scheme is implemented in a series of what will be termed "readout steps," each readout step comprising the generation of a column select signal and a parking interval. During each readout step, what will be called a suite of addresses in input to the decoder. The addresses making up a suite are sequential gray code binary numbers which have been output by the Gray code counter or like device. The suite of addresses is sequentially input to the decoder at a rate determined by the counter.

The first address of the suite is a valid address, meaning it that it is mapped to a signal output (e.g. signal output pin) of the decoder. Accordingly, when this valid address is input, a signal is output by the decoder. The signal is a column selection signal, corresponding to a single column of the array, which opens the readout gates of the cells within the selected column, such that their stored signals are output to the parallel series of shared buses which serve the several columns.

The next one or more address of the suite are parking addresses. This means that these addresses are not mapped to any column selection signal output (e.g. signal output pin) of the decoder. Thus, when these parking addresses are input, no column selection signal output is generated. During this parking interval, pre-charging of the column buses can be performed by the pre-charging circuits.

A suite may comprise two or more input addresses. For example, in one embodiment, the suite comprises two input addresses. Thus, the first input address is a valid address and the second address is a parking address, such that a parking interval is created for every second (i.e. every other) address input.

In other embodiments, a suite may comprise more than two addresses, for example, three, four, or five addresses, such that a single valid address is generated every third, fourth, or fifth address input, respectively.

The first readout step in a readout cycle results in readout of the first column in the array. In each subsequent iteration of the readout step, a different column is addressed and read out, until all the columns in the array have been read out. Columns within an array may be read out in any order, thought it is generally preferred that they be read out sequentially (e.g. each adjacent column being read out, for example top to bottom).

Upon completion of the readout of the last column, the Gray code counter is reset, or turns over to its original starting output value, and the cycle of sequential column readouts is repeated during the next read cycle.

The result of these operations is the creation of a parking interval during the time period that parking addresses are input. Thus, the output of column selection signals is interspersed with a parking interval wherein no column selection signals are generated. These parking addresses therefore provide a time period where all readout outputs are all off line, i.e. not connected to an output, which allows pre-charging of the bus lines and the settling of pre-charge voltages applied to the bus lines before the next output cycle, preventing short circuits or glitches.

The combination of Gray code address inputs and parking intervals minimizes both addressing errors and glitches. Essentially, this scheme creates a valid output address every two or more increments of the counter while advantageously utilizing the single-bit change counting of Gray code to reduce addressing errors.

The decoder circuitry can be operated in conjunction with clock cycles that activate the pre-charge circuits. Alternatively, the counter and addressing scheme may be utilized to drive the pre-charge circuit activations, for example, the parking addresses may be mapped to activate outputs which drive the pre-charging circuits.

The counter may be configured such that its numeric outputs are made at regular, homogenous time intervals. Alternatively, the alternating valid and parking addresses can be output in an asynchronous timing pattern. For example, in one embodiment, the parking intervals can be shorter than the readout intervals (i.e. the transition between valid and invalid address inputs by the counter takes longer than the transition between invalid and valid address inputs to the decoder).

The parking addresses are addresses whose input does not result in a column selection signal being sent from the decoder. However, the decoder may be configured such that output signals other than column selection signals are generated when parking addresses are input. For example, parking addresses may be mapped to outputs which activate the pre-charging circuits, or which turn on or off other components or functions.

It will be understood that the invention encompasses methods, systems, and circuits for carrying out the operations described herein. In one aspect, the invention is directed to a method of method of sequentially addressing a set of columns in an array of memory cells, wherein a parking interval is created in between generation of each column selection signal during, during which parking interval no column selection signal is generated. In another aspect, the invention is directed to a circuit for carrying out the operations of the preceding method. The circuit elements may comprise any components or assembly known in the art which are configured to provide: (1) a sequential Gray code counter that cycles or is capable of reset; (2) and any logic circuits (such as NAND gates) and output signal mechanism, capable of sending a column select signal to the appropriate cell output gates in a column of cells when the valid address corresponding to that column is input to the logic circuits by the Gray code counter.

The methods and circuits of the invention may be implemented in any relevant context, for example in the output of SRAM memory elements, for example on-chip SRAM memory elements as found in image sensors.

EXAMPLE 1

In this example a reflected binary Gray code counter is used, and the decoder is configured to output a valid column selection address for every other input address. The counter outputs addresses of 4 bits and these are input to the decoder logic circuit. Every other address is mapped to a specific column selection addresss. In this example, the words to be output from the memory are 8 bits long, and there are 8 corresponding columns, numbered 0 through 7. The counter creates a sequence of 16 addresses which are input to the decoder logic circuit. The first input address results is mapped to a column output selection signal corresponding to the first column; the second input address is not mapped to a column selection output; the third input address is mapped to a column selection signal output, and so on. The sequence of Gray code address inputs, decimal equivalents, and the columns to which the addresses are mapped are presented together in Table 1.

TABLE 1

| Gray code counter outputs/decoder logic circuit inputs | Decimal equivalent | Column address mapped to Gray code input |
|---|---|---|
| 0000 | 0 | 0 |
| 0001 | 1 | Parking |
| 0010 | 3 | 1 |
| 0011 | 2 | Parking |
| 0101 | 6 | 2 |
| 0100 | 7 | Parking |
| 0111 | 5 | 3 |
| 0110 | 4 | Parking |
| 1100 | 12 | 4 |
| 1101 | 13 | Parking |
| 1111 | 15 | 5 |
| 1110 | 14 | Parking |
| 1010 | 10 | 6 |
| 1011 | 11 | Parking |
| 1001 | 9 | 7 |
| 1000 | 8 | Parking |

Figure 2:
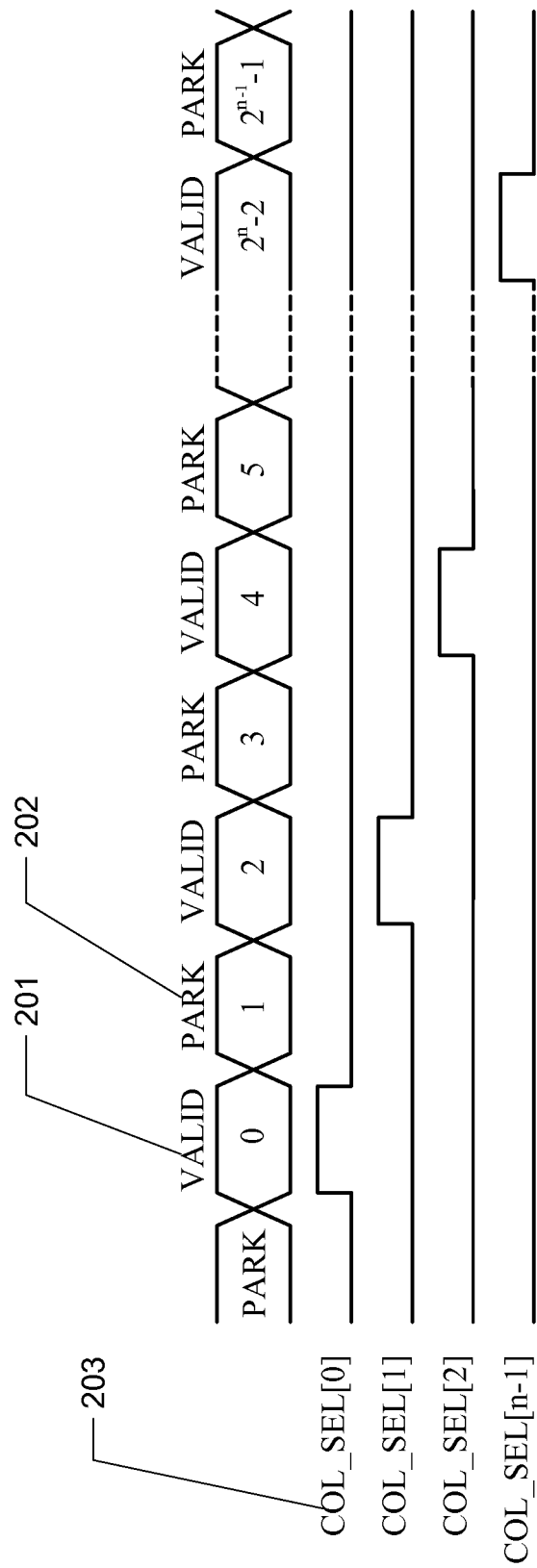
FIG. 2 depicts an exemplary decoder waveform and column output select timing signals.
Figure 3:
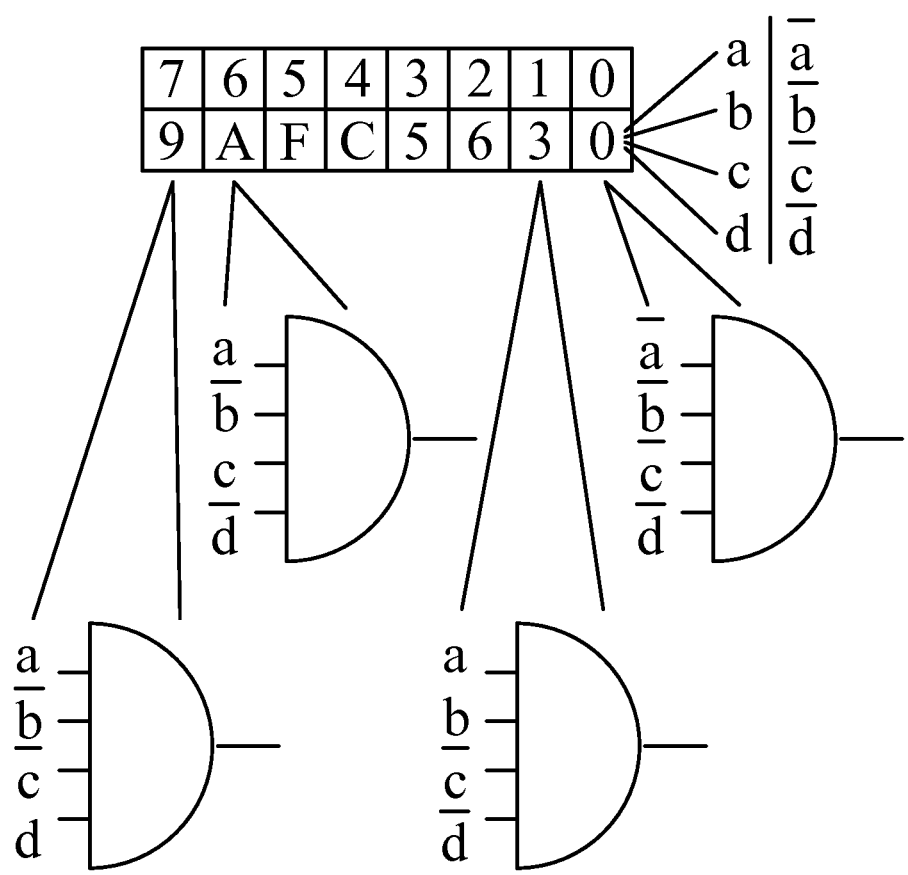
FIG. 3 depicts an exemplary logic diagram for address generation and address column output mapping.

An exemplary representation of the decoder functions in this example is depicted in FIG. 1. The decoder 101 encompasses a counter 102, which generates a series of sequentially increasing output digits of n bits, which serve as addresses. Every other address is a valid address 103, e.g. the $0^{th}$, $2^{nd}$, $4^{th}$, etc. address, up to 2n–2. The valid addresses are mapped by logic circuits 104 to create a series of column select outputs 105 addressed to the $0^{th}$, $1^{st}$, $2^{nd}$, etc. column, up to the 2(n–1)–1 column. Implementation of this decoder block results in a signal timing regime such as that depicted in FIG. 2: the first input of an address to the decoder is a valid address 201, resulting in a valid column selection signal 203 being generated, e.g. the column 0 selection signal is activated; a parking interval occurs as the next address is input from the Gray code counter, such address not being mapped to a activate a column selection output by the decoder 202; then the column 1 selection is activated; followed by another parking interval, etc. A logic diagram implementing the exemplary parking scheme is presented in FIG. 3, with the top row of values representing the output columns addressed and the bottom row representing the input Gray code address values corresponding to each addressed column, depicted in hexadecimal format.

All patents, patent applications, and publications cited in this specification are herein incorporated by reference to the same extent as if each independent patent application, or publication was specifically and individually indicated to be incorporated by reference. The disclosed embodiments are presented for purposes of illustration and not limitation. While the invention has been described with reference to the described embodiments thereof, it will be appreciated by those of skill in the art that modifications can be made to the structure and elements of the invention without departing from the spirit and scope of the invention as a whole.

The invention claimed is:

1. A method of sequentially addressing a set of X columns in an array of memory cells, the method comprising a set of X readout steps, wherein a separate column is addressed in each readout step and X readout steps are performed and each readout step comprises: a Gray code counter outputting a series of sequential Gray code values to a decoder block;

the decoder block is configured such that a first input address value included in the series of sequential Gray code values is mapped to activate a column selection output signal from the decoder, corresponding to a specific column, and at least one subsequent value of the series does not activate any column output signal from the decoder such that a parking interval is created after activation of the column selection signal, and during said parking interval no column selection signal is generated by the decoder, wherein pre-charging of readout buses is performed by pre-charging circuits during the parking interval.

2. The method of claim 1, wherein the array of memory cells comprises a SRAM memory element.

3. The method of claim 2, wherein the SRAM memory element comprises an on-chip memory on an image sensor chip.

4. The method of claim 1, wherein the Gray code inputs are binary Gray code values.

5. The method of claim 1, wherein a valid column selection address is generated for every two sequential Gray code addresses input to the decoder block.

6. An address decoder circuit for a series of columns in a memory array comprising a counter which generates a series of sequential Gray code outputs which are input to a decoder logic circuit; and a decoder logic circuit which generates and outputs a single column select signal for every two or more sequential input addresses included in the Gray code outputs, such that a parking interval is present between each column selection output wherein no column selection signals are generated and outputted.

7. The decoder addressing circuit of claim 6, wherein the decoder logic circuit generates a single column select signal for every two sequential input addresses.

8. The decoder addressing circuit of claim 7, wherein the memory array is a SRAM memory element.

9. The decoder addressing circuit of claim 8, wherein the SRAM memory element is an on-chip memory on an image sensor chip.

* * * * *